United States Patent [19]
Czarnul et al.

[11] Patent Number: 5,963,088
[45] Date of Patent: Oct. 5, 1999

[54] FULLY BALANCED ANALOG CIRCUIT

[75] Inventors: Zdzislaw Czarnul, Yokohama; Noriaki Dobashi, Ebina, both of Japan

[73] Assignee: Kabushiki Kaisha Toshiba, Kawasaki, Japan

[21] Appl. No.: 08/902,577

[22] Filed: Jul. 29, 1997

[30] Foreign Application Priority Data

Jul. 29, 1996 [JP] Japan ..................... 8-199062

[51] Int. Cl.$^6$ ............... H03F 3/45; H03F 3/68; H03F 1/34
[52] U.S. Cl. ............... 330/69; 330/84; 330/107
[58] Field of Search ............. 330/84, 107, 124 R, 330/258, 254, 295, 9, 51, 69

[56] References Cited

U.S. PATENT DOCUMENTS

| | | | |
|---|---|---|---|
| 4,088,961 | 5/1978 | Ashley | 330/84 X |
| 4,806,874 | 2/1989 | Michel | 330/107 X |

Primary Examiner—Steven J. Mottola
Attorney, Agent, or Firm—Banner & Witcoff, Ltd.

[57] ABSTRACT

Non-inverting input terminals of first and second operational amplifiers having the same characteristics are connected together. A first circuit is connected between the inverting input terminal of the first operational amplifier and a first signal input terminal. A second circuit is connected between the non-inverting input terminal of the first operational amplifier and the first signal input terminal. The first circuit receives a feedback signal from an output terminal of the first operational amplifier. The second circuit is connected to a reference voltage source. A third circuit is connected between the inverting input terminal of the second operational amplifier and a second signal input terminal. A fourth circuit is connected between the non-inverting input terminal of the second operational amplifier and the second signal input terminal. The third circuit receives a feedback signal from an output terminal of the second operational amplifier. The fourth circuit is connected to the reference voltage source. The first, second, third and fourth circuits have the same element schematics.

14 Claims, 11 Drawing Sheets

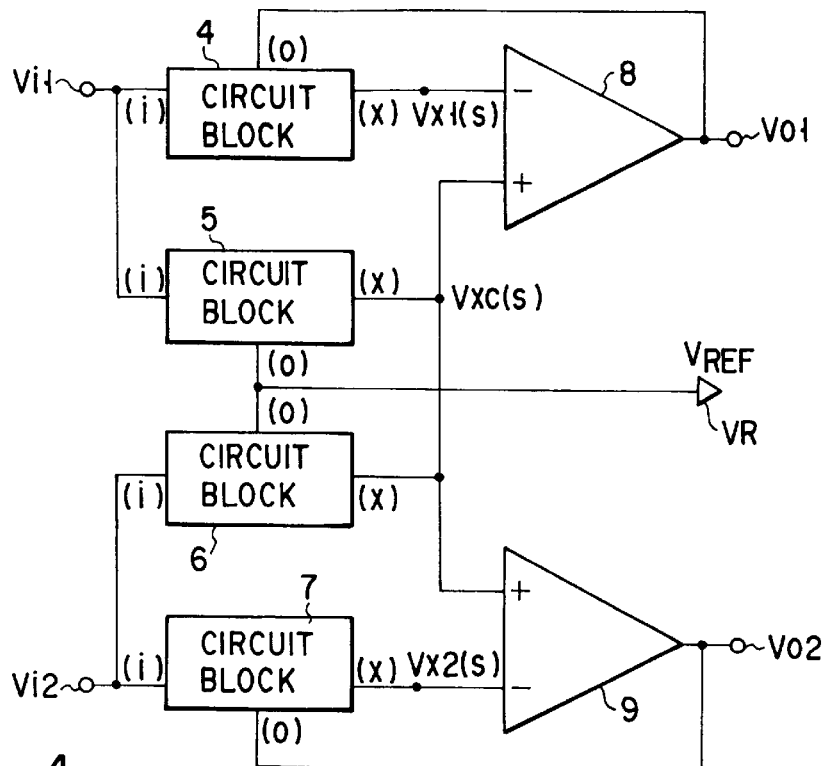
F I G. 4
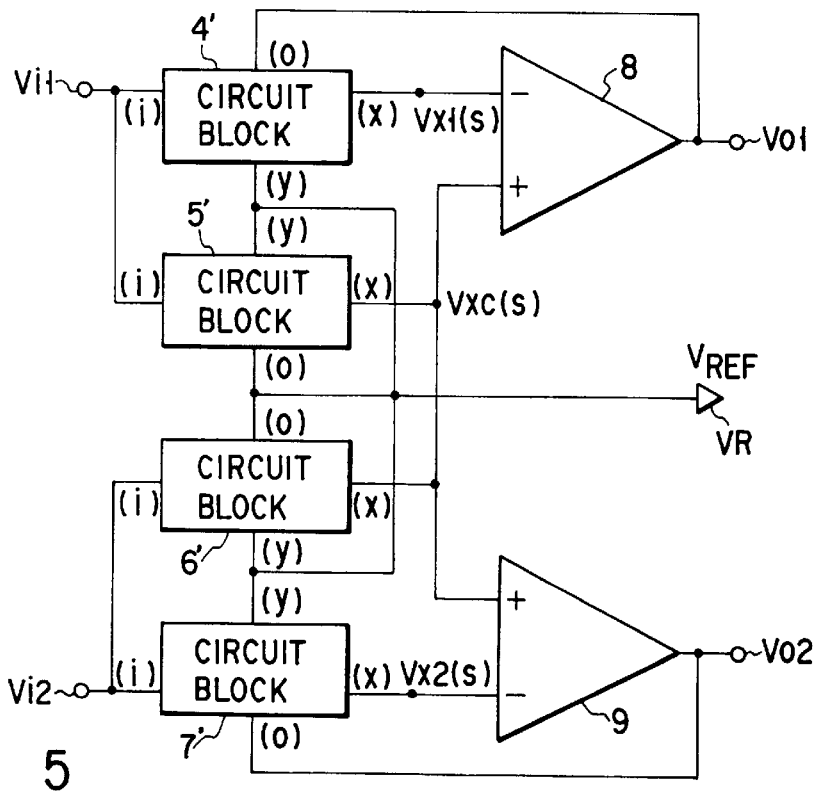
F I G. 5

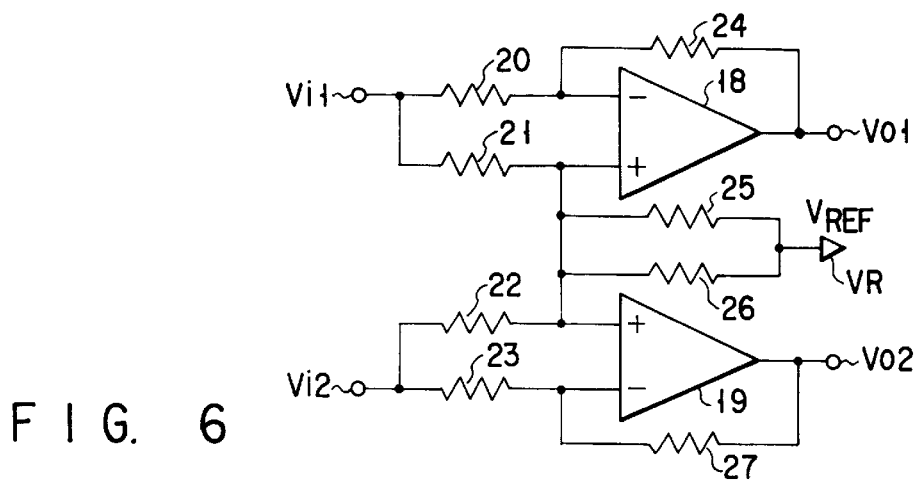
F I G. 6
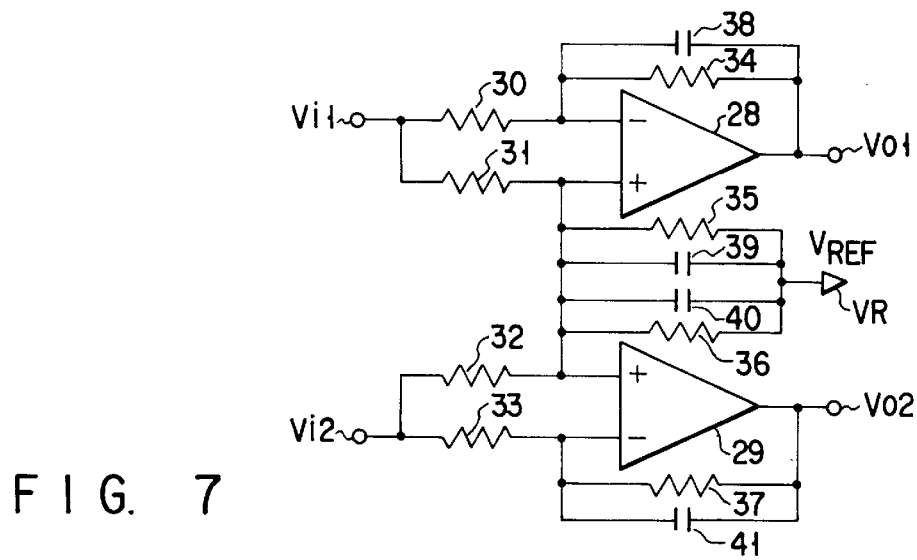
F I G. 7
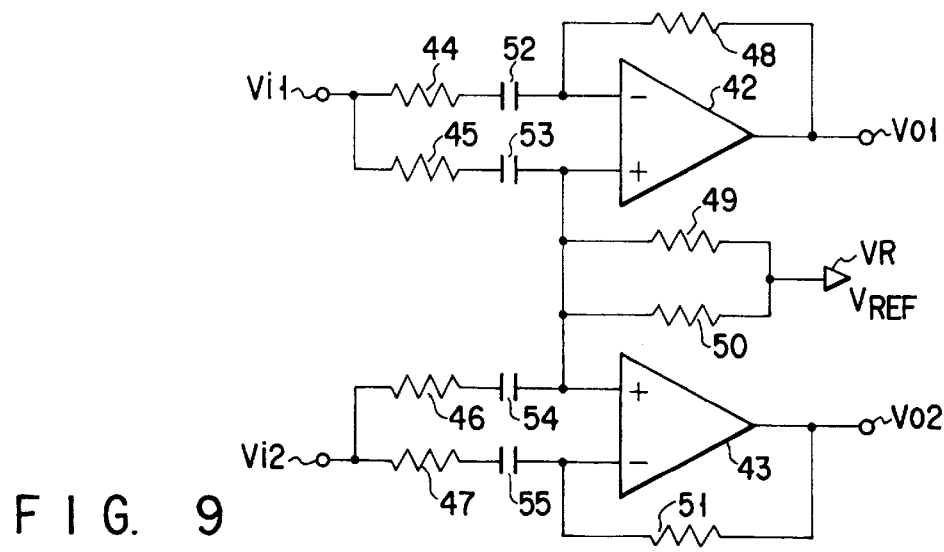
F I G. 9

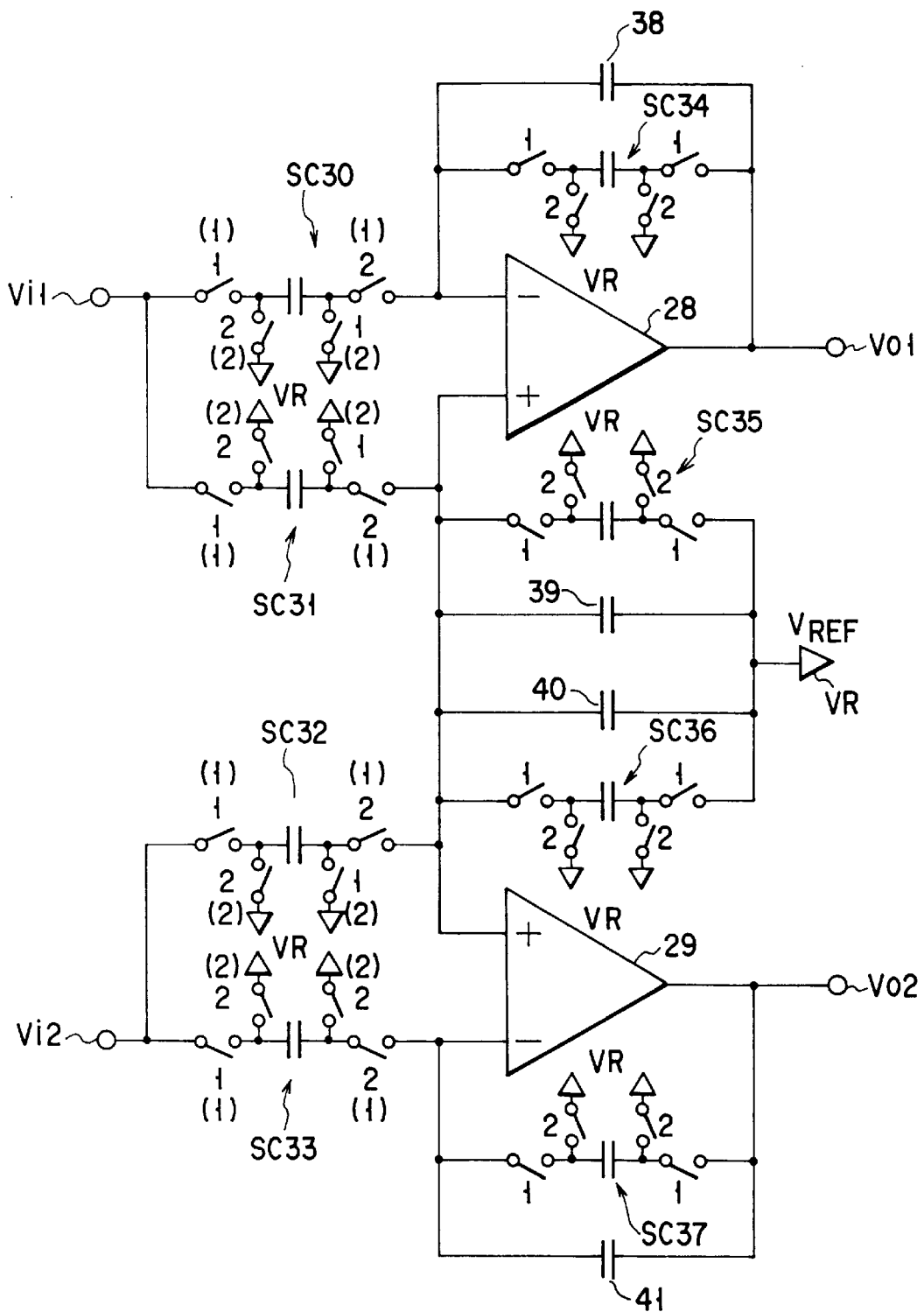
F I G. 8

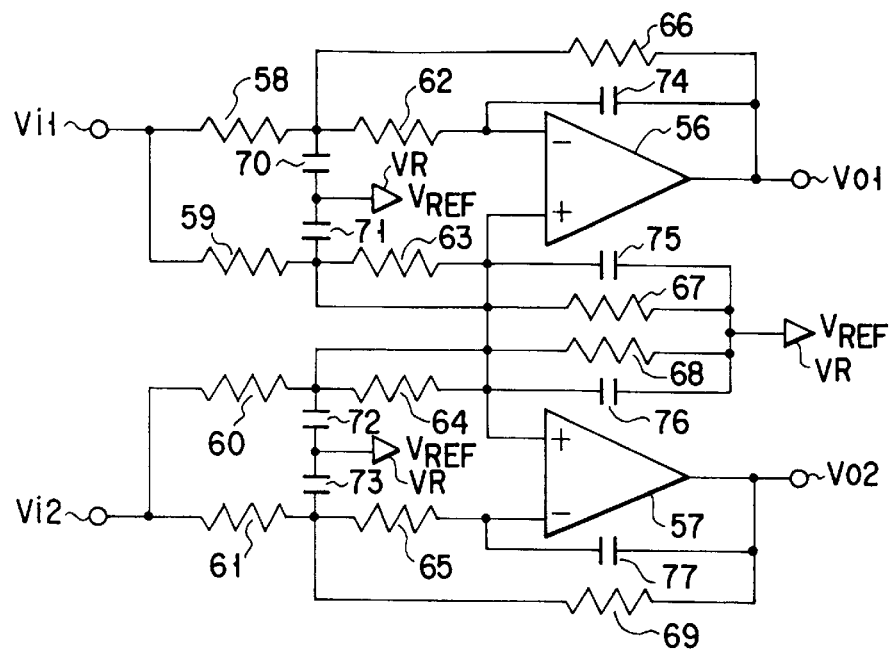
F I G. 10
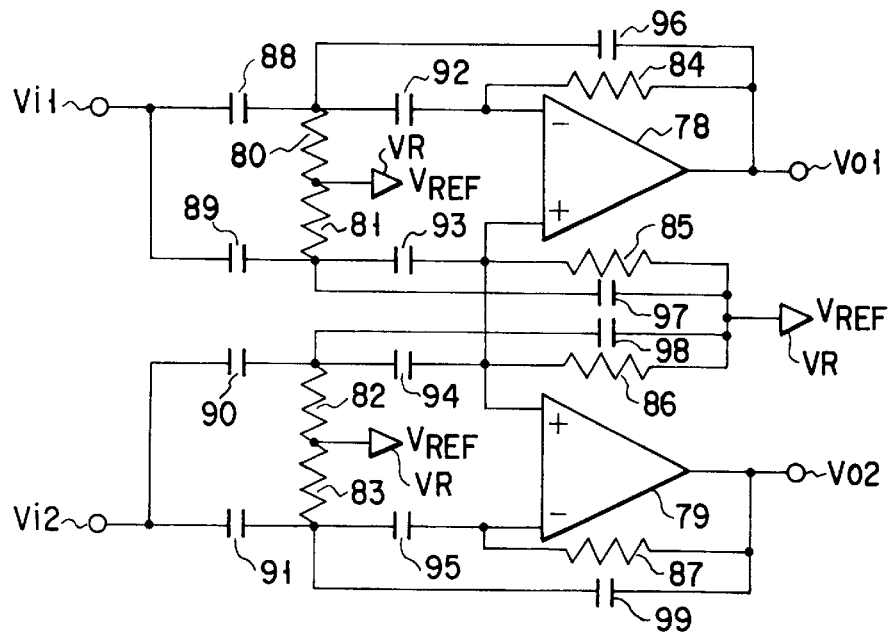
F I G. 11

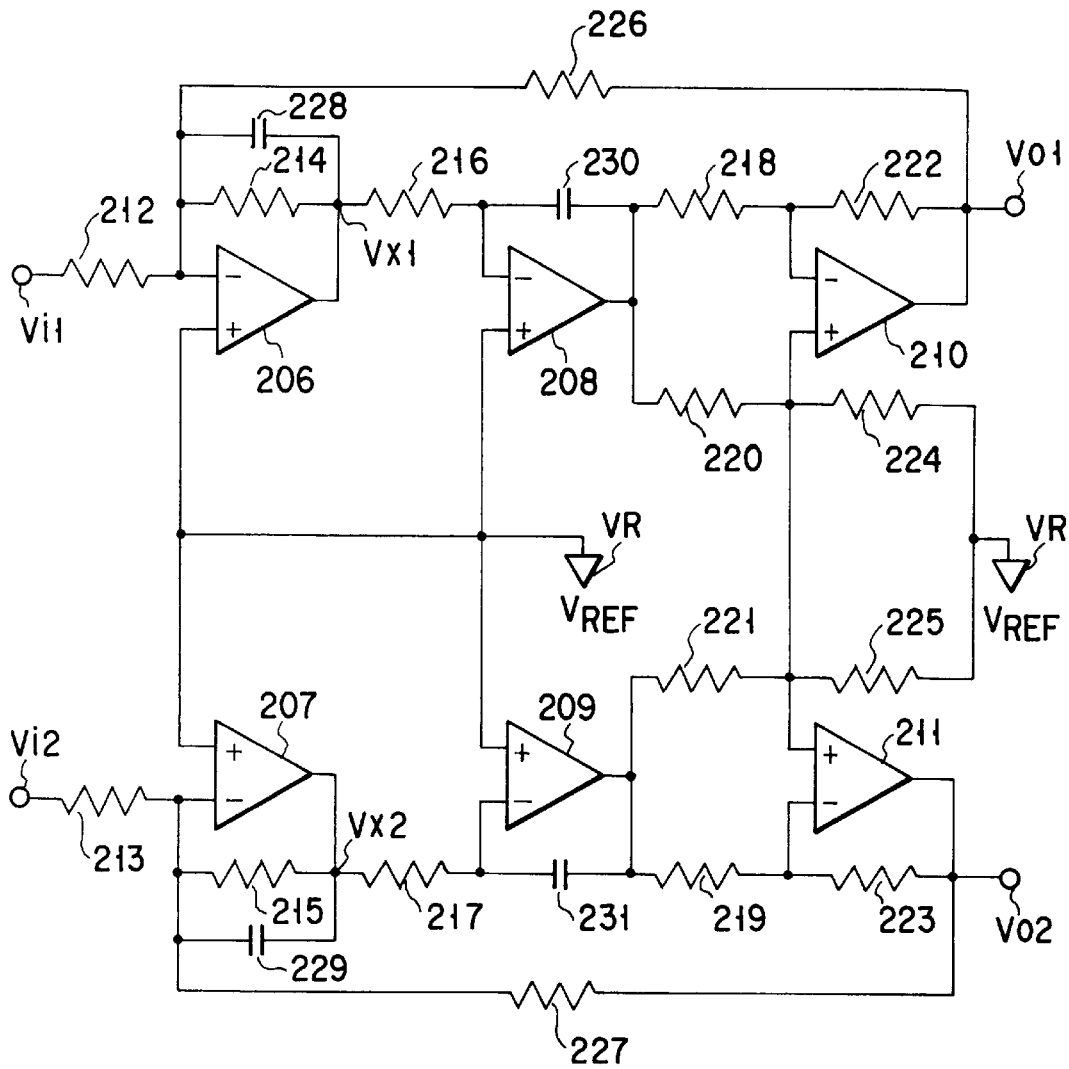
F I G. 12

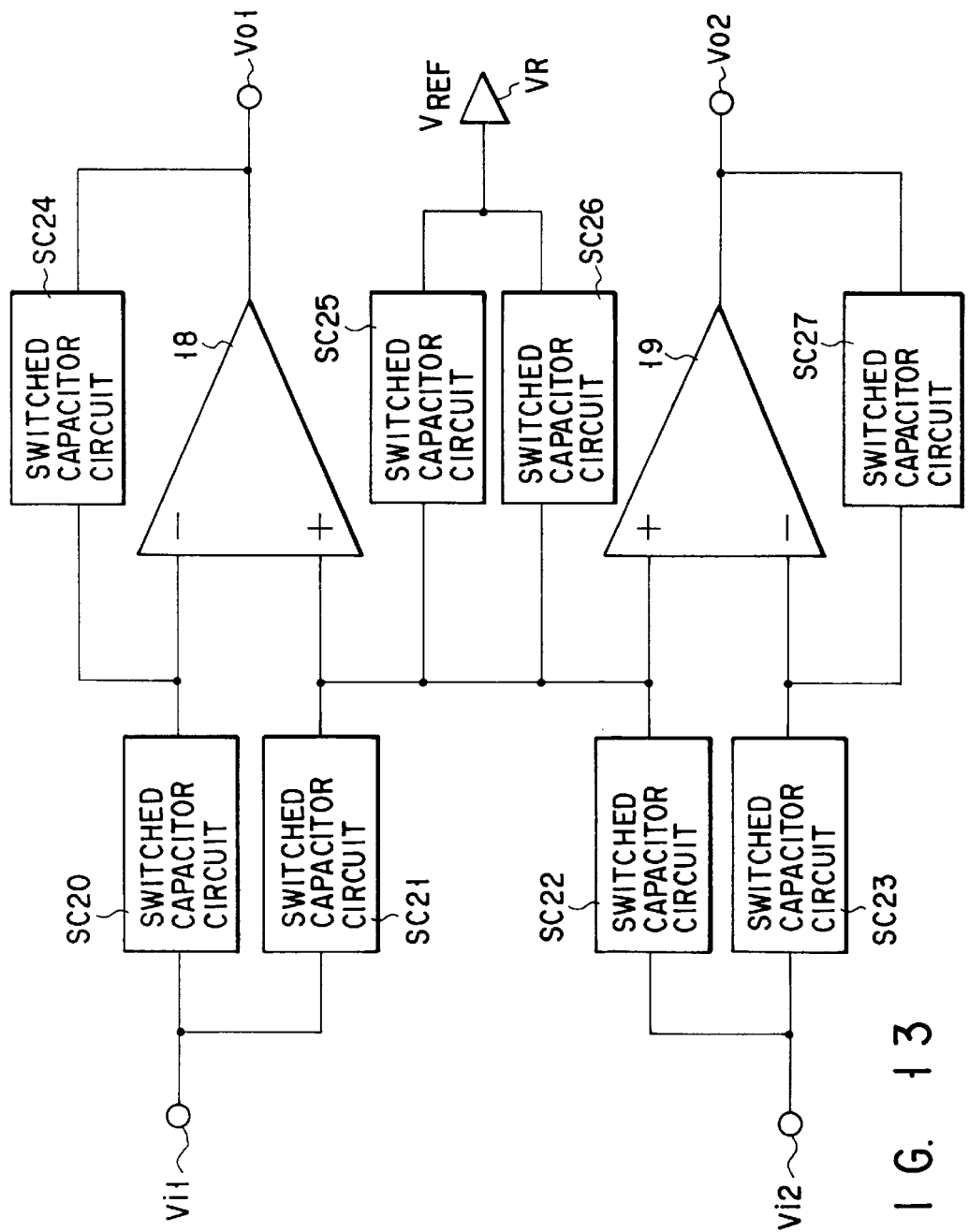
F I G. 13

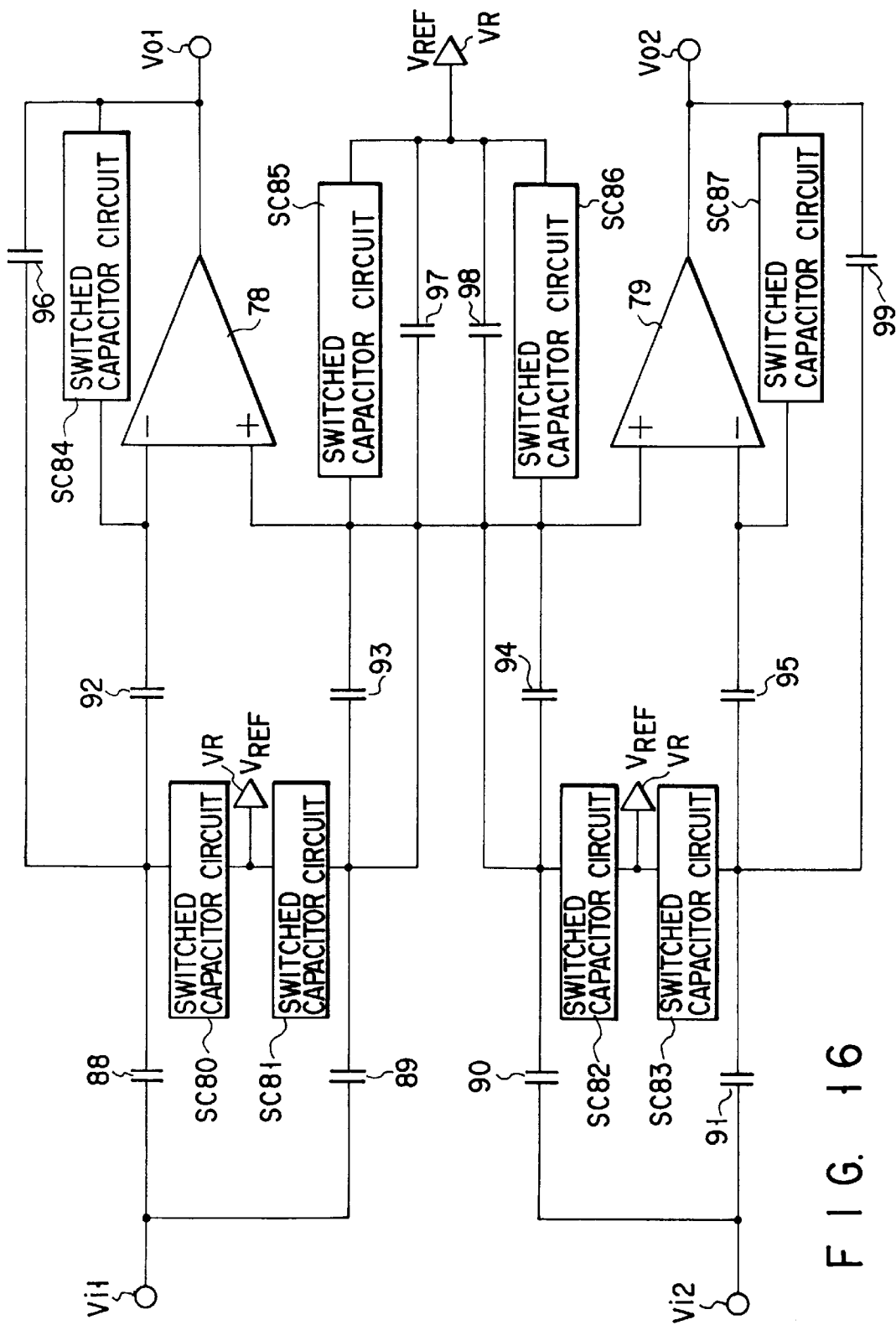
F I G. 16

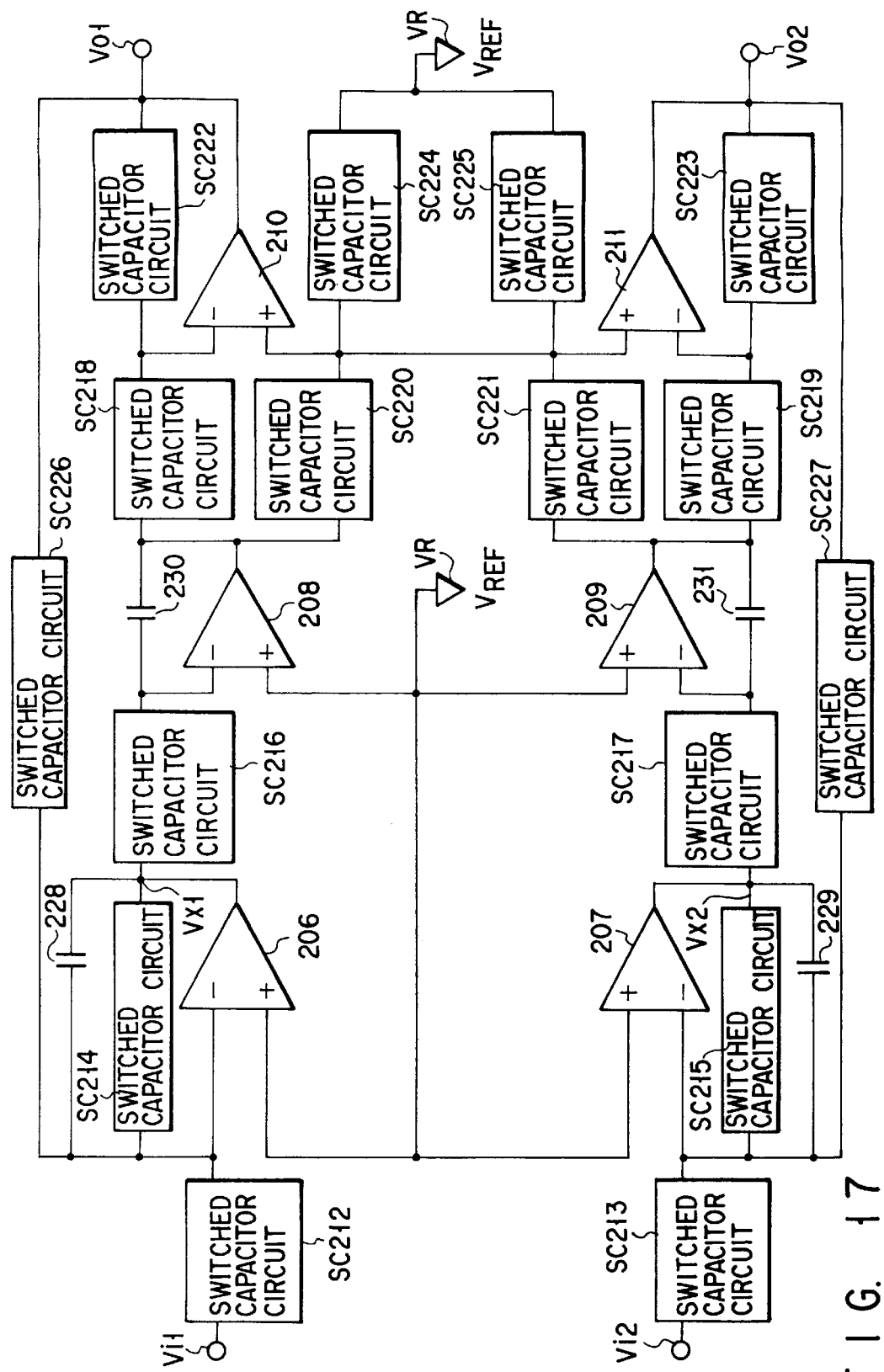
F I G. 17

FULLY BALANCED ANALOG CIRCUIT

BACKGROUND OF THE INVENTION

The present invention relates to a fully balanced analog circuit (or a fully differential analog circuit), and more particularly to a high-speed, fully balanced analog circuit which is particularly capable of not using common mode feedback so that in-phase components of an input signal can be eliminated.

In recent years, demands for digital-analog integrated systems have increased. In this kind of a system, digital circuits and analog circuits are mounted on a single semiconductor chip, and the analog circuits must be designed in consideration of noise, i.e., digital noise from the digital circuits. A typical example of a countermeasure for digital noise is a fully balanced circuit which suppresses noise having in-phase components from anti-phase input signals, a power voltage, and the like.

As a fully balanced analog circuit using an operational amplifier, a circuit as shown in FIG. 1 has been known. This circuit is an inverting amplifier circuit which consists of a fully balanced operational amplifier 16 and four resistors 10, 11, 12, and 13. The resistor 10 is connected between a first signal input terminal Vi1 and an inverting input terminal of the operational amplifier 16. Further, the resistor 12 is connected between the inverting input terminal and the first signal output terminal Vo1, and the resistor 13 is connected between the non-inverting input terminal and the second signal output terminal Vo2. The fully balanced operational amplifier 16 described above includes two feedback resistors 14 and 15 and a common-mode sense amplifier 17. The feedback resistors 14 and 15 are connected in series between the signal output terminals Vo1 and Vo2, and the sense amplifier 17 amplifies and feeds back the difference between the potential of the node of these resistors 14 and 15 and a reference potential $V_{REF}$ of a reference potential supply source VR. The amplifier 17 is connected in such a way that the output components Vo1 and Vo2 do not depend on in-phase input components according to so-called common mode feedback (CMF).

In the circuit shown in FIG. 1, the feedback circuit formed with the resistors 14 and 15 is regarded as a load to the operational amplifier 16. These resistors cannot be set to have very low resistances due to limitations from the driving power (or output current) of the amplifier 16 but the resistances of these resistors must be high to some extent. However, due to the structure of a semiconductor integrated circuit device, a parasitic capacitance is formed between the resistors and a substrate, the parasitic capacitance increases as the resistances increases. Therefore, the parasitic capacitance cannot be neglected with respect to a high-frequency range, so that the frequency characteristic of the circuit is influenced. In addition, there is a possibility that an oscillation is generated due to a phase delay of a signal in the feedback path, in the worst case.

Further, since an operational amplifier of a fully balanced type is more complicated than an ordinary operational amplifier, the design of this amplifier cannot be said to be simple.

BRIEF DESCRIPTION OF THE INVENTION

Therefore, the present invention has an object of providing an analog circuit of a fully balanced type which is capable of suppressing in-phase signals at the differential outputs, without use of common mode feedback, and of ensuring secure operation for a high-frequency range.

Further, another object of the present invention is to provide an analog circuit of a fully balanced type the design of which is simplified and can be realized with standard elements only.

The above objects of the present invention are achieved by a fully balanced analog circuit comprising: a first circuit having non-inverting and inverting input terminals between which virtual grounding is formed; a second circuit having non-inverting and inverting input terminals between which virtual grounding is formed, and having the same characteristic as the first circuit, the non-inverting input terminal of the second circuit being commonly connected together with the non-inverting input terminal of the first circuit; and a third circuit connected between a node of a reference potential supply source and a node of a connecting point between the non-inverting input terminals of the first and second circuits, for setting a potential of the connecting point between the non-inverting input terminals of the first and second circuits. The third circuit with two output terminals serves to set the potential of the non-inverting input terminals of the first and second circuits. The first output terminal is connected to the non-inverting input terminals of the first and second circuits. The second output terminal is connected to a reference potential The main function of the third circuit is to produce a voltage between its two output terminals, respectively, that is equal to an average value of the potential differences between the output terminal and inverting input terminal of the first circuit and between the output terminal and inverting input terminal of the second circuit. The potential of the first terminal of the third circuit is therefore continuously adjusted to $(Vf1+Vf2)/2V_{REF}$ (Vf1: potential difference between the output terminal and the inverting input terminal of the first circuit, Vf2: potential difference between the output terminal and the inverting input terminal of the second circuit, $V_{REF}$: reference potential). The output voltages of the first and second circuits are fully balanced with respect to the fixed potential applied to the reference potential.

The fully balanced analog circuit described above uses common-mode feed-forward, so that in-phase signals can be suppressed without using common-mode feedback and a secure operation can be ensured with respect to a high-frequency range.

Further, the above objects of the present invention are achieved by a fully balanced analog circuit comprising: a first operational amplifier; a second operational amplifier having the same characteristic as the first operational amplifier, and having a non-inverting input terminal connected with a non-inverting input terminal of the first operational amplifier; and potential setting means connected between a reference potential supply source and a connecting point between the non-inverting input terminals of the first and second operational amplifiers, for setting a potential of the connecting point between the non-inverting input terminals of the first and second operational amplifiers. The potential setting means two output terminals serves to set the potential of the non-inverting input terminals of the first and second operational amplifiers. The first output terminal is connected to the non-inverting input terminals of the first and second operational amplifiers. The second output terminal is connected to a reference potential. The main function of the potential setting means is to produce a voltage between its two output terminals, respectively, that is equal to an average value of the potential differences between the output terminal and inverting input terminal of the first operational amplifier and between the output terminal and inverting input terminal of the second operational amplifier. The potential of the first terminal of the potential setting means is therefore continuously adjusted to (Vf1+Vf2)/2+$V_{REF}$ (Vf1: potential difference between the output terminal and the inverting input terminal of the first operational amplifier, Vf2: potential difference between the output terminal and the inverting input terminal of the second operational amplifier, $V_{REF}$: reference potential). The output voltages of the first and second operational amplifiers are fully balanced with respect to the fixed potential applied to the reference potential.

The fully balanced analog circuit described above uses common-mode feed-forward, so that in-phase signals can be suppressed without using common-mode feedback and a secure operation can be ensured with respect to a high-frequency range. Further, since the fully balanced analog circuit is constructed with ordinary operational amplifiers, it is unnecessary to use a common-mode sense amplifier which usually limits the frequency ranges of system operation. Therefore, influences on the frequency characteristics are not caused due to an increase in parasitic capacitance, and the circuit configuration is simplified.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram schematically showing an example of a structure where the circuit shown in FIG. 2 is realized with use of an operational amplifier;

FIG. 5 is a block diagram schematically showing another example of a structure where the circuit shown in FIG. 2 is realized with use of an operational amplifier;

FIG. 6 is a circuit diagram showing an inverting amplifier circuit of a fully balanced type, and explains a fully balanced analog circuit according to a first embodiment of the present invention;

FIG. 7 is a circuit diagram showing a primary low-pass filter of a fully balanced type, and explains a fully balanced analog circuit according to a second embodiment of the present invention;

FIG. 8 is a circuit diagram showing a primary low-pass filter of a fully balanced type using a switched capacitor circuit, and explains a fully balanced analog circuit according to a third embodiment of the present invention;

FIG. 9 is a circuit diagram showing a primary high-pass filter of a fully balanced type, and explains a fully balanced analog circuit according to a fourth embodiment of the present invention;

FIG. 10 is a circuit diagram showing a multiple feedback type secondary low-pass filter of a fully balanced type, and explains a fully balanced analog circuit according to a fifth embodiment of the present invention;

FIG. 11 is a circuit diagram showing a multiple feedback type secondary low-pass filter of a fully balanced type, and explains a fully balanced analog circuit according to a sixth embodiment of the present invention;

FIG. 12 is a circuit diagram showing a multiple feedback type secondary low-pass filter of a fully balanced type, and explains a fully balanced analog circuit according to a seventh embodiment of the present invention; and FIGS. 13 to 17 are circuit diagrams respectively showing fully balanced analog circuits according to eighth to twelfth embodiments of the present invention.

DETAILED DESCRIPTION OF THE INVENTION

Figure 1:
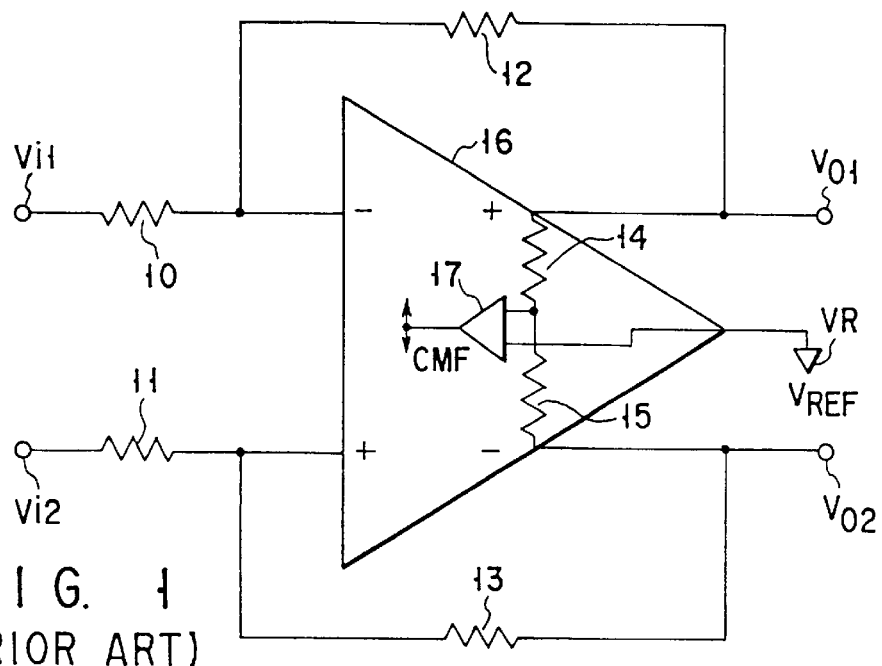
FIG. 1 is a circuit diagram showing an example of a structure of a fully balanced inverting amplifier circuit, and explains the implementation of a conventional fully balanced analog circuit.
Figure 2:
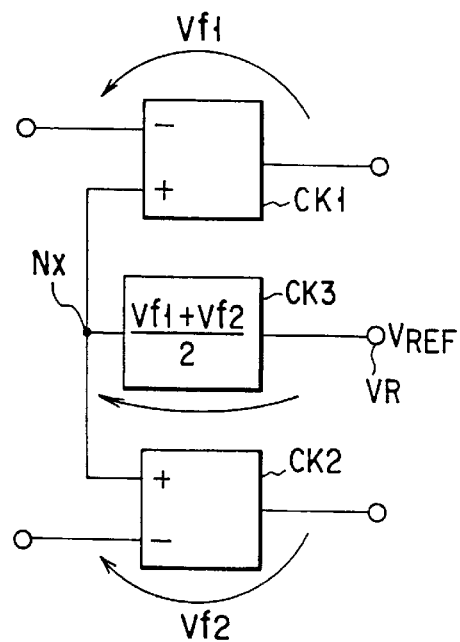
FIG. 2 is a block diagram showing the concept of a fully balanced analog circuit, and explains the basic principle of the present invention.
Figure 3:
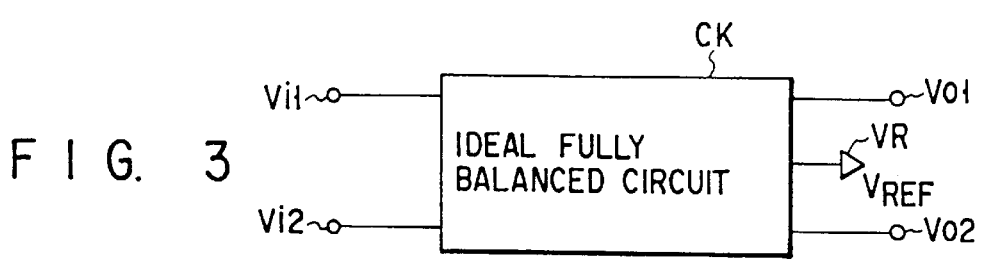
FIG. 3 is a symbolic view explaining the relationship between inputs and outputs in an ideal fully balanced analog circuit.

FIGS. 2 to 5 respectively explain basic principles of the present invention. FIG. 2 is a block diagram showing the concept of a fully balanced analog circuit according to the present invention. FIG. 3 is a symbolic view showing the relationship between inputs and outputs of an ideal fully balanced analog circuit. FIGS. 4 and 5 are block diagrams schematically showing examples of a structure where the fully balanced analog circuit shown in FIG. 2 is realized with use of an operational amplifier.

As shown in FIG. 2, the fully balanced analog circuit of the present invention comprises a first circuit CK1, a second circuit CK2, and a third circuit CK3. The first circuit CK1 provides virtual grounding between a non-inverting input terminal and an inverting input terminal. The second circuit CK2 attains virtual grounding between a non-inverting input terminal and an inverting input terminal and the same characteristics as the first circuit CK1. The non-inverting input terminal of the second circuit CK2 is connected to the non-inverting input terminal of the first circuit CK1. The third circuit CK3 is connected between the connecting point connecting the first and second circuits CK1 and CK2 and a reference potential supply source VR. For example, an operational amplifier, a gm cell (or operational transconductor: OTA), and the like maybe used as the first or second circuits CK1 and CK2. The output of the first circuit CK1 is fed back to the inverting input terminal through a load element (not shown) or the like. The output of the second circuit CK2 is fed back to the inverting input terminal through a feedback element (not shown) or the like. The third circuit CK3 includes a feedback element such as a resistor, or a load element and a capacitive load such as a capacitor or the like. The potential of the connection point Nx of the non-inverting input terminals of the first and second circuits CK1 and CK2 is set to a value (Vf1+Vf2)/2+$V_{REF}$ which is obtained by inserting an average value (Vf1+Vf2)/2, where the potential difference Vf1 is the difference between the output terminal and the inverting input terminal of the first circuit CK1 and the potential difference Vf2 is a difference between the output terminal and the inverting input terminal of the second circuit CK2. In this manner, the output voltages of the first and second circuits CK1 and CK2 are fully balanced with respect to the fixed potential applied to the reference potential $V_{REF}$.

The following equations exist, supposing an ideal fully balanced circuit CK as shown in FIG. 3, where input terminals Vi1 and Vi2 are respectively inputted with signals having potentials Vi1(s) and Vi2(s), potentials of signals respectively outputted from output terminals Vo1 and vo2 are Vo1(s) and Vo2(s), and the fully balanced circuit CK has a coefficient, i.e., a gain K(s).

$$Vo1(s)-Vo2(s)=K(s)\cdot(Vi1(s)-Vi2(s)) \quad (1)$$

and $$\frac{Vo1(s)+Vo2(s)}{2}=VR \quad (2)$$

Thus, in-phase signal components are suppressed.

FIG. 4 shows an example of a schematic structure of the fully balanced analog circuit shown in FIG. 2. In this circuit, an operational amplifier 8 and a circuit block 4 are used as the first circuit CK1, and an operational amplifier 9 and a circuit block 7 are used as the second circuit CK2. Circuit blocks 5 and 6 are used as the third circuit CK3. The operational amplifiers 8 and 9 have a same characteristic. The circuit blocks 4 and 7 respectively have same circuit configurations and circuit characteristics as the circuit blocks 5 and 6. The signal input terminal Vi1 is connected with input terminals (i) of the circuit blocks 4 and 5, and the output terminals (x) of the circuit blocks 4 and 5 are respectively connected to inverting and non-inverting input terminals (−) and (+) of the operational amplifier 8. The output terminal of the operational amplifier 8 is connected to the terminal (o) of the circuit block 4. Likewise, the signal input terminal Vi2 is connected with the input terminals (i) of the circuit blocks 6 and 7, and the output terminals (x) of the circuit blocks 6 and 7 are respectively connected to the non-inverting and inverting input terminals (+) and (−) of the operational amplifier 9. The output terminal of the operational amplifier 9 is connected to the terminals (o) of the circuit block 7. In addition, the terminals (o) of the circuit blocks 5 and 6 are connected to the reference potential supply source VR which is applied with a reference potential $V_{REF}$. Further, the non-inverting input terminals (+) of the operational amplifiers 8 and 9 are connected commonly together.

The circuit block 4 receives a signal input from the signal input terminal Vi1 and outputs signals to to the inverting input terminal and output terminal of the operational amplifier 8. The circuit blocks 5 and 6 serve to set the potential of the non-inverting input terminals of the operational amplifiers 8 and 9 on the basis of signals on to the signal input terminals Vi1, Vi2 and the reference potential $V_{REF}$ of the reference potential supply source VR. The circuit block 7 receives a signal input from the signal input terminal Vi2 and outputs signals to to the inverting input terminal and output terminal of the operational amplifier 9.

In FIG. 4, potentials Vx1(s) and Vx2(s) of the output terminals (x) of the circuit blocks 4 and 7 are expressed as follows, supposing a RC block consisting of resistors and capacitors as circuit blocks 4 to 7 described above, where the input coefficient of the circuit blocks 4 and 7 is Ki and the feedback coefficient is Ko(s).

$$Vx1(s)=Ki(s)Vi1(s)+Ko(s)Vo1(s) \quad (3)$$

$$Vx2(s)=Ki(s)Vi2(s)+Ko(s)Vo2(s) \quad (4)$$

Where the input coefficient of the circuit blocks 5 and 6 is Ki(s), the potential Vxc(s) of the output terminal (s) is expressed as follows.

$$Vxc(s)=Ki(s)\cdot(Vi1(s)+Vi2(s))/2 \quad (5)$$

Therefore, the output signals Vo1(s) and Vo2(s) are expressed as follows from equations concerning the operational amplifier.

$$Vo1(s)=Koa(s)\cdot(Vxc(s)-Vx1(s)) \quad (6)$$

$$Vo2(s)=Koa(s)\cdot(Vxc(s)-Vx2(s)) \quad (7)$$

Here, Koa(s) is a coefficient of the operational amplifiers 8 and 9. From equations (3) to (7), the following equation is obtained.

$$Vo1(s)-Vo2(s)=-\{Ki(s)/(\mu(s)+Ko(s))\}\cdot(Vi1(s)-Vi2(s)) \quad (8)$$

Here, $\mu(s)=1/Koa(s)$ exists. Further, the following equation is satisfied, so that in-phase signal components are suppressed.

$$Vo1(s)+Vo2(s)=0 \quad (9)$$

By comparing equations (1) and (2) with equations (8) and (9), it is apparent that the case of FIG. 4 complies with the ideal case. Hence, it is noted that a fully balanced circuit can be realized by achieving the structure shown in FIG. 4.

In the case of the circuit shown in FIG. 4, the potential Vxc(s) can be expressed by two feedback voltages Vf1 and Vf2. From equations (3) and (4), the feedback voltages Vf1 and Vf2 of the operational amplifiers 4 and 7 can be obtained as follows.

$$Vf1=Vx1(s)-Vo1(s)=Ki(s)Vi1(s)+(Ko1(s)-1)\cdot Vo1(s) \quad (10)$$

$$Vf2=Vx2(s)-Vo2(s)=Ki(s)Vi2(s)+(Ko1(s)-1)\cdot Vo2(s) \quad (11)$$

From equations (10) and (11), the following is obtained.

$$(Vf1+Vf2)/2=(Ki(s)\cdot(Vi1(s)+Vi2(s)))/2+((Ko(s)-1) \quad (12)$$

Here, since Vo1(s)+Vo2(s)=0 exists, the following is obtained from the equation (12).

$$(Vf1+Vf2)/2=(Ki(s)\cdot(Vi1(s)+Vi2(s)))/2 \quad (13)$$

The potential of the output terminals (x) of the circuit blocks 5 and 6, i.e., the potential Vxc(s) of the input terminals of the operational amplifiers 8 and 9 is expressed as follows.

$$Vxc(s)=(Vf1+Vf2)/2 \quad (14)$$

The equations (3) to (14) described above are based on the assumption that $V_{REF}=0V$.

FIG. 5 shows another example of a structure of the circuit shown in FIG. 2. An operational amplifier 8 and a circuit block 4' are used as the first circuit CK1. An operational amplifier 9 and a circuit block 7' are used as the second circuit CK2. Circuit blocks 5' and 6' are used as the third circuit CK3. The circuit shown in FIG. 5 is obtained in a manner in which the circuit blocks 4, 5, 6, and 7 shown in FIG. 4 are provided with terminals (y) and are connected to a reference potential supply source VR. Since the equations (3) to (14) described above do not include components related to the terminal by providing terminals (y), the structure shown in FIG. 5 is substantially the same as that of the circuit shown in FIG. 4, so that in-phase input signals are suppressed without use of common-mode feedback.

Next, detailed explanation will be made to a specific example of the structure of a fully balanced analog circuit constructed on the basis of basic principle of the invention described above.

FIG. 6 explains a fully balanced analog circuit according to a first embodiment of the present invention, and shows an inverting amplifier circuit constructed with use of the basic principle of the present invention, in a practiced form of the circuit shown in FIG. 4. The inverting amplifier circuit consists of two operational amplifiers 18 and 19 and eight resistors 20 to 27. First terminals of resistors 20 and 21 are commonly connected to a signal input terminal Vi1, and the second terminal of the resistors 20 and 21 are respectively connected to inverting and non-inverting input terminals of the operational amplifier 18. The resistor 24 is connected between the input and output terminals of the operational amplifier 18. A first terminal of the resistor 25 is connected to the non-inverting input terminal of the operational amplifier 18, and a second terminal of the resistor 25 is connected to the reference potential supply source VR which is applied with a reference potential $V_{REF}$. Likewise, first terminals resistors 22 and 23 are commonly connected to the signal input terminal Vi2, and the other ends of the resistors 22 and 23 are respectively connected to the non-inverting and inverting input terminals of the operational amplifier 19. The resistor 27 is connected between the inverting input terminal and the output terminal of the operational amplifier 19. A first terminal of the resistor 26 is connected to the non-inverting terminal of the operational amplifier 19, and the other end thereof is connected to the reference potential supply source VR. Further, non-inverting input terminals of the operational amplifiers 18 and 19 are connected together. Here, the operational amplifiers 18 and 19 have the same characteristics (transfer characteristics, mutual conductance, frequency characteristics, input impedance and output impedance). The resistors 20 and 23 have the same resistance, the resistors 21 and 22 have the same resistance, the resistors 24 and 27 have the same resistance, and the resistors 25 and 26 have the same resistance. The ratio of the resistance of the resistor 20 to that of the resistor 21 is the same as the ratio of the resistance of the resistor 24 to the resistance of the resistor 25.

According to the above structure, it is possible to provide an inverting amplifier circuit of a fully balanced type which is capable of suppressing in-phase signals and is capable of ensuring secure operation with respect to a high-frequency range. Besides, since this structure is constructed using normal operational amplifiers and resistors, the circuit structure is simple and the design is simplified.

FIG. 7 explains a fully balanced analog circuit according to a second embodiment of the present invention, in which a primary low-pass filter of a fully balanced type is constructed by realizing a practical example of the circuit shown in FIG. 4. This primary low-pass filter consists of two operational amplifiers 28 and 29, eight resistors 30 to 37, and four capacitors 38 to 41. The resistors 30 and 31 are connected at one end (or node) to the signal input terminal Vi1. The other ends (or node) of the resistors 30 and 31 are respectively connected to the inverting and non-inverting input terminals of the operational amplifier 28. The resistor 34 and the capacitor 38 are connected in parallel between the inverting input terminal and the output terminal of the operational amplifier 28. A first terminal of the resistor 35 and a first electrode capacitor 39 are connected at one end to the non-inverting input terminal of the operational amplifier 28, and the other terminal of the resistor 35 and the other electrode of the capacitor 39 are connected to the reference potential supply source VR. Likewise, first terminals the resistors 32 and 33 are commonly connected to the signal input terminal Vi2, and second terminals of the resistors 32 and 33 are respectively connected to the non-inverting and inverting input terminals of the operational amplifier 29. The resistor 37 and the capacitor 41 are connected in parallel between the inverting input terminal and the output terminal of the operational amplifier 29. A first terminal of the resistor 36 and one electrode (node) of the capacitor 40 are connected to the non-inverting input terminal of the operational amplifier 29, and the other terminal of the resistor 36 and the other electrode (node) of the capacitor 40 are connected to the reference potential supply source VR. Further, the non-inverting input terminals of the operational amplifiers 28 and 29 are commonly connected. Here, the operational amplifiers 28 and 29 have the same characteristics. The resistors 30 and 33 have the same resistance, the resistors 31 and 32 have the same resistance, the resistors 34 and 37 have the same resistance, and the resistors 35 and 36 have the same resistances, respectively. The capacitors 38 and 41 as well as the capacitors 39 and 40 have the same capacitances, respectively. The ratio of the resistance of the resistor 30 to that of the resistor 31, the ratio of the resistance of the resistor 34 to the resistance of the resistor 35, and the ratio of the impedance of the capacitor 38 to that of the capacitor 39 are equal.

According to the structure as described above, it is possible to provide a primary low-pass filter of a fully balanced type which is capable of suppressing in-phase signals and of ensuring secure operation with respect to a high-frequency range. Besides, since this structure is constructed using normal operational amplifiers, resistors, and capacitors, the circuit structure is simple and the design is simplified.

FIG. 8 shows a fully balanced analog circuit according to a third embodiment of the present invention in which the circuit shown in FIG. 4 is realized, and shows another example of a structure in which a primary low-pass filter of a fully balanced type is constructed as in the second embodiment. In the circuit shown in FIG. 8, resistors 30 to 37 in the primary low-pass filter of FIG. 7 are respectively replaced with switched capacitor circuits SC30 to SC37. Each of the switched capacitor circuits SC30 to SC37 consists of one capacitor and four switches, e.g., transistors for controlling charging and discharging of the capacitor.

The capacitor of the switched capacitor circuit SC30 is connected between the signal input terminal Vi1 and the reference potential supply source VR at a first operation timing, and is connected between the reference potential supply source VR and the inverting input terminal of the operational amplifier 28 at a second operation timing. The capacitor of the switched capacitor circuit SC31 is connected between the signal input terminal Vi1 and the reference potential supply source VR at the first operation timing, and is connected between the reference potential supply source VR and the non-inverting input terminal of the operational amplifier 28. The capacitor of the switched capacitor circuit SC32 is connected between the signal input terminal Vi2 and the reference potential supply source VR at the first operation timing, and is connected between the reference potential supply source VR and the non-inverting input terminal of the operational amplifier 29. The capacitor of the switched capacitor circuit SC33 is connected between the signal input terminal Vi2 and the reference potential supply source VR at the first operation timing, and is connected between the reference potential supply source VR and the inverting input terminal of the operational amplifier 29 at the second operation timing. The capacitor of the switched capacitor circuit SC34 is connected between the inverting input terminal and the output terminal of the operational amplifier 28 at the first operation timing, and both electrodes of the capacitor are connected to the reference potential supply source VR at the second operation timing. The capacitor of the switched capacitor circuit SC35 is connected between the non-inverting input terminal of the operational amplifier 28 and the reference potential supply source VR at the first operation timing, and both electrodes of the capacitor 35 are connected to the reference potential supply source VR at the second operation timing. The capacitor of the switched capacitor circuit SC36 is connected between the non-inverting input terminal of the operational amplifier 29 and the reference potential supply source VR at the first operation timing, and both electrodes of the capacitor are connected to the reference potential supply source VR at the second operation timing. Further, the capacitor of the switched capacitor circuit SC37 is connected between the inverting input terminal and the output terminal of the operational amplifier 29 at the first operation timing, and both electrodes are connected to the reference potential supply source VR at the second operation timing.

By selectively turning on/off switches in switched capacitor circuits SC30 to SC37 to charge/discharge the capacitors, these circuits can be used as equivalent resistors, so that the same circuit operation as in the embodiment shown in FIG. 7 can be achieved. Therefore, the same functions and advantages can be obtained as in the embodiment shown in FIG. 7. Specifically, the capacitor of the switched capacitor circuit SC30 is connected between the signal input terminal Vi1 and the inverting input terminal of the operational amplifier 28 at the first operation timing, and both electrodes are connected to the reference potential supply source VR at the second operation timing. The capacitor of the switched capacitor circuit SC31 is connected between the signal input terminal Vi1 and the non-inverting input terminal of the operational amplifier 28 at the first operation timing, and both electrodes are connected to the reference potential supply source VR at the second operation timing. In addition, the capacitor of the switched capacitor circuit SC32 is connected between the signal input terminal Vi2 and the non-inverting input terminal of the operational amplifier 29 at the first operation timing, and both electrodes are connected to the reference potential supply source VR at the second operation timing. The capacitor of the switched capacitor circuit SC33 is connected between the signal input terminal Vi2 and the inverting input terminal of the operational amplifier 29 at the first operation timing, and both electrodes are connected to the reference potential supply source VR at the second operation timing.

FIG. 9 explains a fully balanced analog circuit according to a fourth embodiment of the present invention in which the circuit shown in FIG. 4 is realized, and shows another example of a structure in which a primary high-pass filter of a fully balanced type is constructed as in the second embodiment. This primary high-pass filter consists of two operational amplifiers 42 and 43, eight resistors 44 to 51, and four capacitors 52 to 55. First terminals of the resistors 44 and 45 are connected to the signal input terminal Vi1, the capacitors 52 and 53 are respectively connected between second terminals of the resistors 44 and 45 and the inverting and non-inverting input terminals of the operational amplifier 42. The resistor 48 is connected between the inverting input terminal and the output terminal of the operational amplifier 42. A first terminal of the resistor 49 is connected to the non-inverting input terminal of the operational amplifier 42, and the second terminals thereof is connected to the reference potential supply source VR. Likewise, first terminals of the resistors 46 and 47 are connected to the signal input terminal Vi2, and the capacitors 54 and 55 are respectively connected between second terminals of the resistors 46 and 47 and the non-inverting and inverting input terminals of the operational amplifier 43. The resistor 51 is connected between the inverting input terminal and the output terminal of the operational amplifier 43. A first terminal of the resistor 50 is connected to the non-inverting input terminal of the operational amplifier 43, and a second terminal thereof is connected to the reference potential supply source VR so that a reference potential $V_{REF}$ is applied. Further, non-inverting input terminals of the operational amplifiers 42 and 43 are connected. Here, the operational amplifiers 42 and 43 have same characteristics. The resistors 44 and 47 have the same resistance, the resistors 45 and 46 have the same resistance, the resistors 48 and 51 have the same resistance, and the resistor 49 and 50 have the same resistances. The capacitors 52 and 55 as well as the capacitors 53 and 54 have the same capacitances, respectively. The ratio of the resistance of the resistor 44 to the resistance of the resistor 45 are equal to each other, the ratio of the resistance of the resistor 48 to the resistance of the resistor 49 are equal to each other, and the ratio of the impedance of the capacitor 52 to the impedance of the capacitor 53 are equal to each other.

According to the structure as described above, it is possible to provide a primary high-pass filter of a fully balanced type which is capable of suppressing in-phase signals and ensuring secure operation with respect to a high-frequency range. Besides, since this structure is constructed using normal operational amplifiers, resistors, and capacitors, the circuit structure is simple and the design is simplified.

FIG. 10 explains a fully balanced analog circuit according to a fifth embodiment of the present invention in which the circuit shown in FIG. 5 is realized, and shows another example of a structure in which a multiple feedback type secondary low-pass filter of a fully balanced type is constructed. This multiple feedback type secondary low-pass filter consists of two operational amplifiers 56 and 57, twelve resistors 58 to 69, and eight capacitors 70 to 77. Resistors 58 and 62 are connected in series between the signal input terminal Vi1 and the inverting input terminal of the operational amplifier 56, and the resistors 59 and 63 are connected in series between the signal input terminal Vi1 and the non-inverting input terminal of the operational amplifier 56. The resistor 66 is connected between the output terminal of the operational amplifier 56 and the connecting point between the resistors 58 and 62, and the capacitor 74 is connected between the inverting input terminal and the output terminal of the operational amplifier 56. One electrode of the capacitor 70 is connected to the connecting point between the resistors 58 and 62, and the other electrode is connected to the reference potential supply source VR. One electrode of the capacitor 71 is connected to the connecting point between the resistors 59 and 63, and the other electrode is connected to the reference potential supply source VR. A first terminal of the resistor 67 is connected to the connecting point between the resistors 59 and 63, and a second terminal thereof is connected to the reference potential supply source VR. One electrode of the capacitor 75 is connected to the non-inverting input terminal of the operational amplifier 56, and the other electrode thereof is connected to the reference potential supply source VR. Likewise, the resistors 61 and 65 are connected in series between the signal input terminal Vi2 and the inverting input terminal of the operational amplifier 57, and the resistors 60 and 64 are connected in series between the signal input terminal Vi2 and the non-inverting input terminal of the operational amplifier 57. The resistor 69 is connected between the output terminal of the operational amplifier 57 and the connecting point between the resistors 61 and 65, and the capacitor 77 is connected between the inverting input terminal and the output terminal of the operational amplifier 57. One electrode of the capacitor 72 is connected to the connecting point between the resistors 60 and 64, and the other electrode is connected to the reference potential supply source VR. One electrode of the capacitor 73 is connected to the connecting point between the resistors 61 and 65, and the other electrode thereof is connected to the reference potential supply source VR. A first terminal of the resistor 68 is connected to the connecting point between resistors 60 and 64, and a second terminal thereof is connected to the reference potential supply source VR. One electrode of the capacitor 76 is connected to the non-inverting input terminal of the operational amplifier 57, and the other end thereof is connected to the reference potential supply source VR. Further, the non-inverting terminals of the operational amplifiers 56 and 57 are commonly connected, and the output terminal of the operational amplifier 56 is connected to the signal output terminal Vo1 while the output terminal of the operational amplifier 57 is connected to the signal output terminal Vo2. Here, the operational amplifiers 56 and 57 have the same characteristics. The resistors 58 and 61 have the same resistance, the resistors 59 and 60 have the same resistance, the resistors 62 and 65 have the same resistance, the resistors 63 and 64 have the same resistance, the resistors 66 and 69 have the same resistance, and the resistors 67 and 68 have the same resistance. The capacitors 70 and 73 have the same capacitance, the capacitors 71 and 72 have the same capacitance, the capacitors 74 and 77 have the same capacitance, the capacitors 75 and 76 have the same capacitance. The ratio of the resistance of the resistor 58 to the resistance of the resistor 59 are equal to each other, the ratio of the resistance of the resistor 62 to the resistance of the resistor 63 are equal to each other, the ratio of the resistance of the resistor 66 to the resistance of the resistor 67 are equal to each other, the ratio of the impedance of the capacitor 70 to the impedance of the capacitor 71 are equal to each other, and the ratio of the impedance of the capacitor 74 to the impedance of the capacitor 75 are equal to each other.

According to the structure as described above, it is possible to provide a multiple feedback type secondary low-pass filter of a fully balanced type which is capable of suppressing in-phase signals and ensuring secure operation with respect to a high-frequency range. Besides, since this structure is constructed using of normal operational amplifiers, resistors, and capacitors, the circuit structure is simple and the design is simplified.

FIG. 11 explains a fully balanced analog circuit according to a sixth embodiment of the present invention in which the circuit shown in FIG. 5 is realized, and shows another example of a structure in which a multiple feedback type secondary high-pass filter of a fully balanced type is constructed. This multiple feedback type secondary high-pass filter consists of two operational amplifiers 78 and 79, eight resistors 80 to 87, and twelve capacitors 88 to 99, and has a circuit structure in which the resistors are replaced with the capacitors in FIG. 10. Specifically capacitors 88 and 92 are connected in series between the signal input terminal Vi1 and the inverting input terminal of the operational amplifier 78, and the capacitors 89 and 93 are connected in series between the signal input terminal Vi1 and the non-inverting input terminal of the operational amplifier 78. The capacitor 96 is connected between the output terminal of the operational amplifier 78 and the connecting point between the capacitors 88 and 92, and the resistor 84 is connected between the inverting input terminal and the output terminal of the operational amplifier 78. One node of the resistor 80 is connected to the connecting point between the capacitors 88 and 92, and the other node thereof is connected to the reference potential supply source VR. One node of the resistor 81 is connected to the connecting point between the capacitors 89 and 93, and the other node is connected to the reference potential supply source VR. One node of the capacitor 97 is connected to the connecting point between the capacitors 89 and 93, and the other node thereof is connected to the reference potential supply source VR. One terminal of the resistor 85 is connected to the non-inverting input terminal of the operational amplifier 78, and the other end thereof is connected to the reference potential supply source VR. Likewise, the capacitors 91 and 95 are connected in series between the signal input terminal Vi2 and the inverting input terminal of the operational amplifier 79, and the capacitors 90 and 94 are connected in series between the signal input terminal Vi2 and the non-inverting input terminal of the operational amplifier 79. The capacitor 99 is connected between the output terminal of the operational amplifier 79 and the connecting point between the capacitors 91 and 95, and the resistor 87 is connected between the inverting input terminal and the output terminal of the operational amplifier 79. One terminal of the resistor 82 is connected to the connecting point between the capacitors 90 and 94, and the other terminal thereof is connected to the reference potential supply source VR. One terminal of the resistor 83 is connected to the connecting point between the capacitors 91 and 95, and the other terminal thereof is connected to the reference potential supply source VR. One node of the capacitor 98 is connected to the connecting point between resistors 90 and 94, and the other node thereof is connected to the reference potential supply source VR. One node of the resistor 86 is connected to the non-inverting input terminal of the operational amplifier 79, and the other node thereof is connected to the reference potential supply source VR. Further, the non-inverting terminals of the operational amplifiers 78 and 79 are commonly connected together, and the output terminal of the operational amplifier 78 is connected to the signal output terminal Vo1 while the output terminal of the operational amplifier 79 is connected to the signal output terminal Vo2. Here, the operational amplifiers 78 and 79 have the same characteristics, and the resistors 80 and 83 have the same resistance, the resistors 81 and 82 have the same resistance, the resistors 84 and 87 have the same resistance, and the resistors 85 and 86 have the same resistance. The capacitors 88 and 91, the capacitors 89 and 90, the capacitors 92 and 95, and the capacitors 93 and 94, the capacitors 96 and 99, and the capacitors 97 and 98 have the same capacitances, respectively. The ratio of the resistance of the resistor 80 to the resistance of the resistor 81, the ratio of the resistance of the resistor 84 to the resistance of the resistor 85, the ratio of the impedance of the capacitor 88 to the impedance of the capacitor 89, the ratio of the impedance of the capacitor 92 to impedance of the capacitor 93, and the ratio of the impedance of the capacitor 96 to the impedance of the capacitor 97 are equal to each other.

According to the structure as described above, it is possible to provide a multiple feedback type secondary high-pass filter of a fully balanced type which is capable of suppressing in-phase signals and ensuring secure operation with respect to a high-frequency range. Besides, since this structure is constructed with use of normal operational amplifiers, resistors, and capacitors, the circuit structure is simple and the design is simplified.

FIG. 12 explains a fully balanced analog circuit according to a seventh embodiment of the present invention in which circuits as shown in FIG. 4 are combined with each other and are realized to construct a bi-cut type secondary low-pass filter of a fully balanced type. This bi-cut type secondary low-pass filter of a fully balanced type consists of six operational amplifiers 206 to 211, sixteen resistors 212 to 227, and four capacitors 228 to 231. The resistor 212 is connected between the signal input terminal Vi1 and the inverting input terminal of the operational amplifier 206, and the resistor 214 and the capacitor 228 are connected in parallel between the inverting input terminal of the operational amplifier 206 and the output terminal Vx1. The resistor 216 is connected between the output terminal Vx1 of the operational amplifier 206 and the inverting input terminal of the operational amplifier 208. The capacitor 230 is connected between the inverting input terminal and the output terminal of the operational amplifier 208. The resistor 218 is connected between the output terminal of the operational amplifier 208 and the inverting input terminal of the operational amplifier 210, and the resistor 220 is connected between the output terminal of the operational amplifier 208 and the non-inverting input terminal of the operational amplifier 210. The resistor 222 is connected between the inverting input terminal and the output terminal of the operational amplifier 210. One terminal of the resistor 226 is connected to the inverting input terminal of the operational amplifier 206, and the other terminal thereof is connected to the signal output terminal Vo1 of the operational amplifier 210. One node of the resistor 224 is connected to the non-inverting input terminal of the operational amplifier 210, and the other node thereof is connected to the reference potential supply source VR.

Likewise, the resistor 213 is connected between the signal input terminal Vi2 and the inverting input terminal of the operational amplifier 207, and the resistor 215 and the capacitor 229 are connected in parallel between the inverting input terminal and the output terminal Vx2 of the operational amplifier 207. The resistor 217 is connected between the output terminal Vx2 of the operational amplifier 207 and the inverting input terminal of the operational amplifier 209. The capacitor 231 is connected between the inverting input terminal and the output terminal of the operational amplifier 209. The resistor 219 is connected between the output terminal of the operational amplifier 209 and the inverting input terminal of the operational amplifier 211, and the resistor 221 is connected between the output terminal of the operational amplifier 209 and the non-inverting input terminal of the operational amplifier 211. The resistor 223 is connected between the inverting input terminal and the output terminal of the operational amplifier 211. One terminal of the resistor 225 is connected to the non-inverting input terminal of the operational amplifier 211, and the other terminal thereof is connected to the reference potential supply source VR. The non-inverting input terminals of the operational amplifiers 206, 207, 208, and 209 are connected to the reference potential supply source VR, and the non-inverting input terminals of the operational amplifiers 210 and 211 are commonly connected together.

Here, the operational amplifiers 206 and 207, the operational amplifiers 208 and 209, and the operational amplifiers 210 and 211 have the same characteristics, respectively. In addition, the resistors 212 and 213, the resistors 214 and 215, the resistors 216 and 217, the resistors 218 and 219, the resistors 220 and 221, the resistors 222 and 223, the resistors 224 and 225, and the resistors 226 and 227 have same resistances, respectively. Further, the capacitors 228 and 229 and the capacitors 230 and 231 have the same capacitances, respectively. The ratio of the resistance of the resistor 218 to the resistance of the resistor 220 is equal to the ratio of the resistance of the resistor 218 to the resistance of the resistor 220.

According to the structure as described above, it is possible to provide a bi-cut type secondary low-pass filter of a fully balanced type which is capable of suppressing in-phase signals and ensuring secure operation with respect to a high-frequency range. Besides, since this structure is constructed using normal operational amplifiers, resistors, and capacitors, the circuit structure is simple and the design is simplified.

Figure 14:
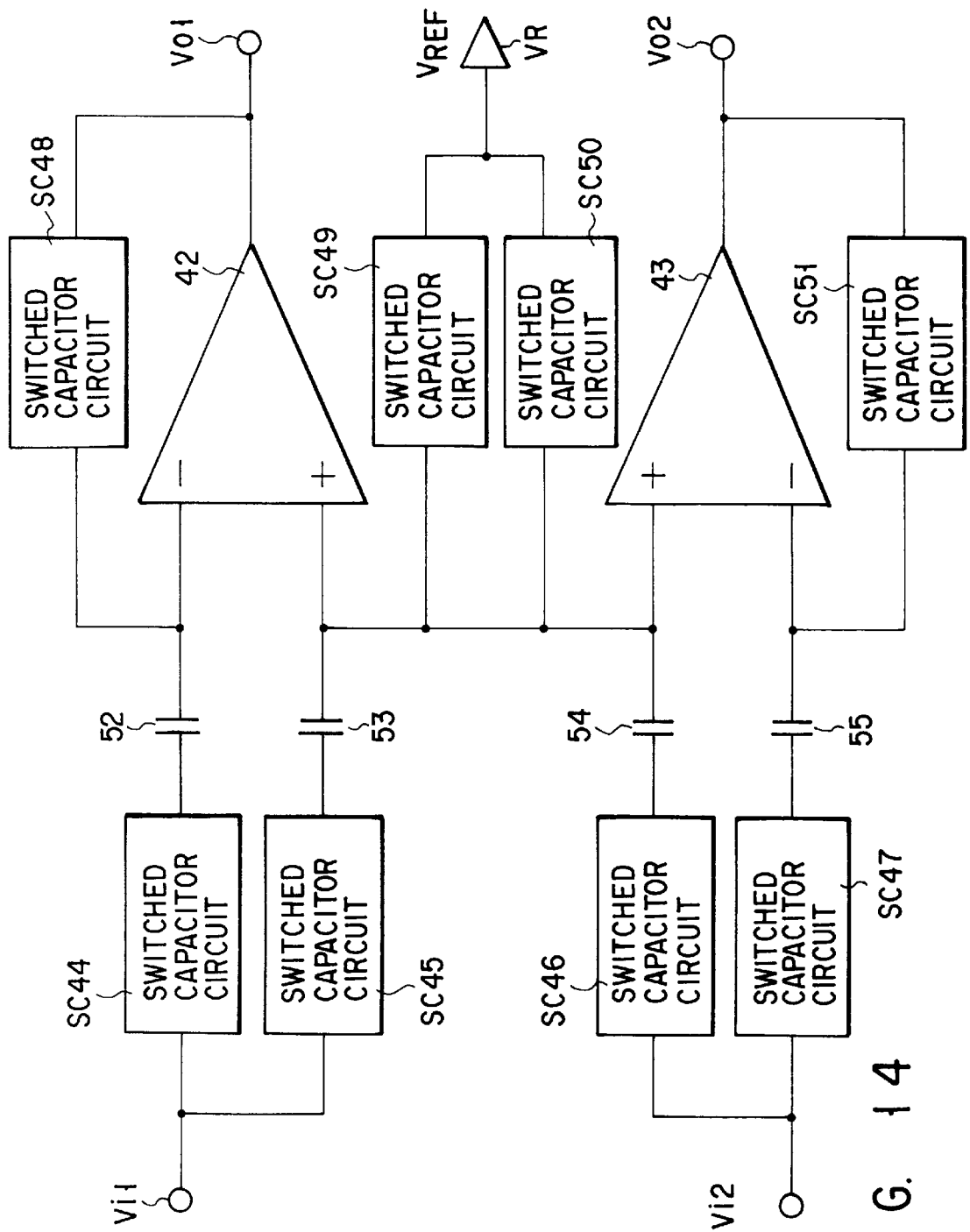
Figure 15:
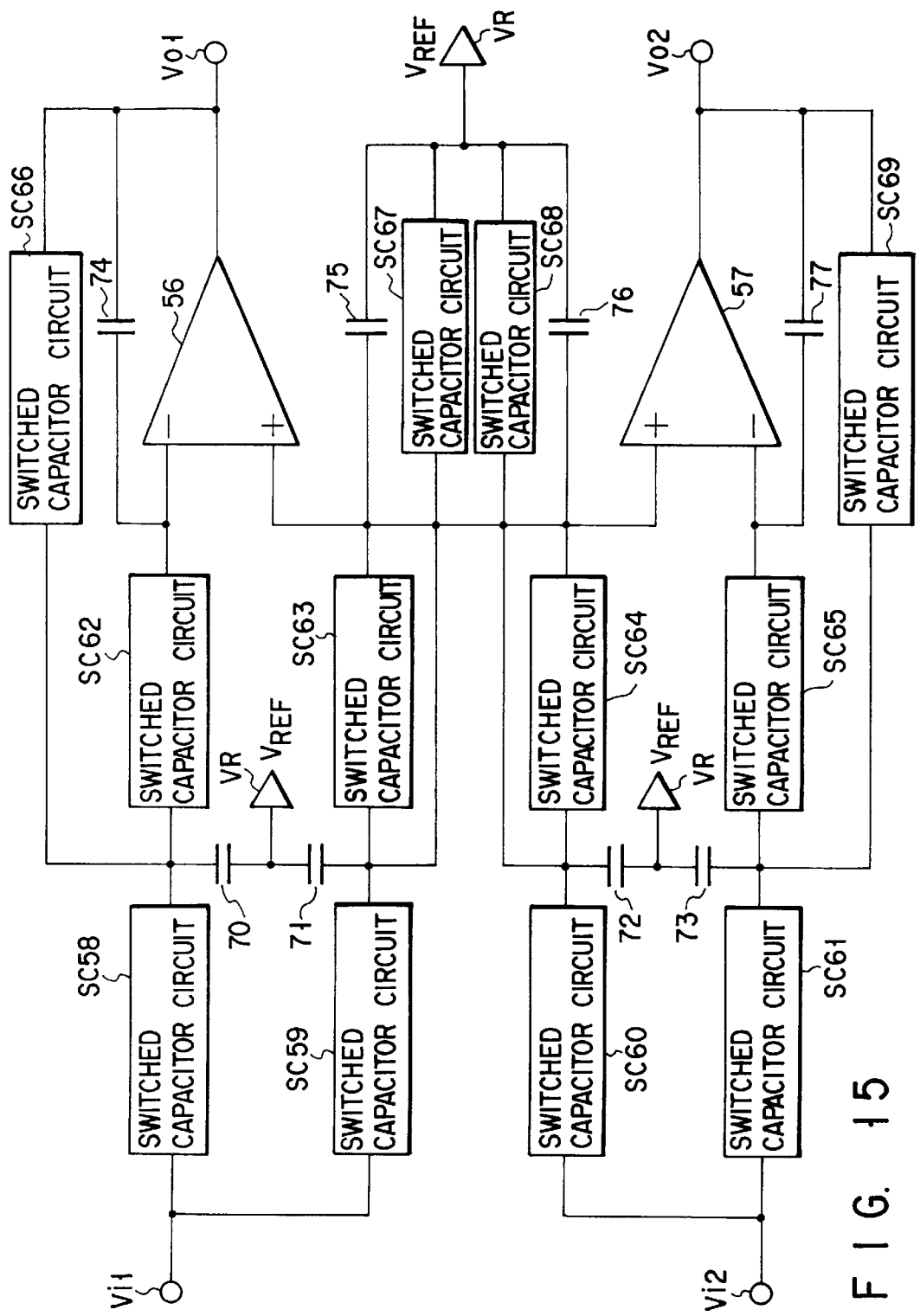

FIGS. 13 to 17 are circuit diagrams respectively explaining fully balanced analog circuits according to eighth to twelfth embodiments of the present invention. In the above third embodiment, switched capacitor circuits are used in place of resistors in the second embodiment. Likewise, the eighth to twelfth embodiments are constructed by replacing resistors with switched capacitor circuits in circuits according to the first embodiment and fourth to seventh embodiments. Specifically, FIG. 13 shows a structure in which the resistors 20 to 27 in the circuit shown in FIG. 6 are replaced with the switched capacitor circuits SC20 to SC27, respectively. FIG. 14 shows a structure in which the resistors 44 to 51 in the circuit shown in FIG. 9 are replaced with switched capacitor circuits SC44 to SC51, respectively. FIG. 15 shows a structure in which the resistors 58 to 69 in the circuit shown in FIG. 10 are replaced with switched capacitor circuits SC58 to SC69, respectively. FIG. 16 shows a structure in which the resistors 80 to 87 in the circuit shown in FIG. 9 are replaced with switched capacitor circuits SC80 to SC87, respectively. Further, FIG. 17 shows a structure in which the resistors 212 to 227 in the circuit shown in FIG. 12 are replaced with switched capacitor circuits SC212 to SC227, respectively. Each of the switched capacitor circuits SC20 to SC27, SC44 to SC51, SC58 to SC69, SC80 to SC87, and SC212 to SC227 can adopt the same circuit structure as the switched capacitor circuits SC30 to SC37 in the circuit shown in FIG. 8. However, each of the switched capacitor circuits may adopt a structure different from that of the switched capacitor circuits in the circuit shown in FIG. 8.

The structure in which the resistor are replaced with switched capacitor circuits, as shown in the eighth to twelfth embodiments, naturally attain the same functions and advantages as the circuits according to the first and fourth to seventh embodiments.

Although the first to twelfth embodiments have been explained while reciting an inverting amplifier circuit, a primary low-pass filter, a primary high-pass filter, a multiple feedback type secondary low-pass filter, a multiple feedback type secondary high-pass filter, and a bi-cut type secondary low-pass filter, as examples of the fully balanced analog circuits, the present invention is not limited to these embodiments but can be practiced in various modifications, on the basis of the basic principle explained with reference to FIGS. 2 to 5. In addition, the circuits shown in the third and eighth to twelfth embodiments have been explained as examples in which all the resistors are replaced with switched capacitor circuits. However, in each of these examples, at least a part of the resistors may be replaced with switched capacitor circuits.

As has been explained above, according to the present invention, it is possible to provide a fully balanced analog circuit which is capable of suppressing in-phase signals without using of common mode feedback and ensuring secure operation with respect to a high-frequency range. In addition, it is possible to obtain a fully balanced analog circuit the design of which is simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A fully balanced analog circuit comprising:

a first operational amplifier;

a first circuit block having three nodes, first and second nodes being connected with an inverting input terminal of the first operational amplifier and a first signal input terminal, respectively, and a third node which receives an output directly fed back from the first operational amplifier;

a second circuit block having three nodes, a first node and second node being connected to the first signal input terminal and the non-inverting input terminal of the first operational amplifier, respectively, and a third node which is supplied with a reference potential directly from a reference potential supply source;

a second operational amplifier having a non-inverting input terminal commonly connected with the non-inverting input terminal of the first operational amplifier;

a third circuit block having three nodes, a first node and a second node being connected to an inverting input terminal of the second operational amplifier and a second signal input terminal, respectively, and a third node which receives an output fed directly back from the second operational amplifier; and a fourth circuit block having three nodes, a first node and a second node being connected to the second signal input terminal and the non-inverting input terminal of the second operational amplifier, respectively, and a third node which is supplied with the reference potential directly from the reference potential supply source, the second and fourth circuit blocks together setting a potential of the common non-inverting input terminal of the first and second operational amplifiers, wherein first and second input signals are supplied from the first and second signal input terminals, and first and second output signals are respectively obtained from first and second signal output terminals connected to output terminals of the first and second operational amplifiers, wherein the first and second operational amplifiers are matched, the first, second, third and fourth circuit blocks have the same element schematics, the first and third circuit blocks are matched, and the second and fourth circuit blocks are matched.

2. A fully balanced analog circuit according to claim 1, wherein the first and third circuit blocks are connected to the reference potential of the reference potential supply source.

3. A fully balanced analog circuit comprising:

a first operational amplifier;

a first resistor connected between an inverting input terminal of the first operational amplifier and a first signal input terminal;

a second resistor connected between a non-inverting input terminal of the first operational amplifier and the first signal input terminal;

a third resistor connected between the inverting input terminal of the first operational amplifier and a first signal output terminal;

a fourth resistor, without being connected in parallel to a capacitor, connected between the non-inverting input terminal of the first operational amplifier and a reference potential supply source;

a second operational amplifier having a non-inverting input terminal commonly connected with the non-inverting input terminal of the first operational amplifier;

a fifth resistor connected between an inverting input terminal of the second operational amplifier and a second signal input terminal;

a sixth resistor connected between the non-inverting input terminal of the second operational amplifier and the second signal input terminal;

a seventh resistor connected between the inverting input terminal of the second operational amplifier and a second signal output terminal; and an eighth resistor, without being connected in parallel to a capacitor, connected between the non-inverting input terminal of the second operational amplifier and the reference potential supply source, wherein the first and second operational amplifiers have same characteristics, the first and fifth resistors have same resistance values, the second and sixth resistors have same resistance values, the third and seventh resistors have same resistance values, the fourth and eighth resistors have same resistance values, and a ratio of the resistance value of the first resistor to the resistance value of the second resistor is equal to a ratio of the resistance value of the third resistor to the resistance value of the fourth resistor.

4. A fully balanced analog circuit comprising:

a first operational amplifier;

a first resistor connected between an inverting input terminal of the first operational amplifier and a first signal input terminal;

a second resistor connected between a non-inverting input terminal of the first operational amplifier and the first signal input terminal;

a third resistor connected between the inverting input terminal of the first operational amplifier and a first signal output terminal;

a fourth resistor connected between the non-inverting input terminal of the first operational amplifier and a reference potential supply source;

a second operational amplifier having a non-inverting input terminal commonly connected with the non-inverting input terminal of the first operational amplifier;

a fifth resistor connected between an inverting input terminal of the second operational amplifier and a second signal input terminal;

a sixth resistor connected between the non-inverting input terminal of the second operational amplifier and the second signal input terminal;

a seventh resistor connected between the inverting input terminal of the second operational amplifier and a second signal output terminal;

an eighth resistor connected between the non-inverting input terminal of the second operational amplifier and the reference potential supply source;

a first capacitor connected between the inverting input terminal of the first operational amplifier and the first signal output terminal;

a second capacitor connected between the non-inverting input terminal of the first operational amplifier and the reference potential supply source;

a third capacitor connected between the inverting input terminal of the second operational amplifier and the second signal output terminal; and a fourth capacitor connected between the non-inverting input terminal of the second operational amplifier and the reference potential supply source, wherein the first and third capacitors have an equal capacitance, the second and fourth capacitors have an equal capacitance, and the ratio of the resistance value of the first resistor to the resistance value of the second resistor is equal to a ratio of an impedance of the first capacitor to an impedance of the second capacitors, and wherein the first and second operational amplifiers have same characteristics, the first and fifth resistors have same resistance values, the second and sixth resistors have same resistance values, the third and seventh resistors have same resistance values, the fourth and eighth resistors have same resistance values, and a ratio of the resistance value of the first resistor to the resistance value of the second resistor is equal to a ratio of the resistance value of the third resistor to the resistance value of the fourth resistor.

5. A fully balanced analog circuit according to claim 3, further comprising:

a first capacitor connected between the first resistor and the inverting input terminal of the first operational amplifier;

a second capacitor connected between the second resistor and the non-inverting input terminal of the first operational amplifier;

a third capacitor connected between the fifth resistor and the inverting input terminal of the second operational amplifier; and a fourth capacitor connected between the sixth resistor and the non-inverting input terminal of the second operational amplifier, wherein the first and third capacitors have an equal capacitance, the second and fourth capacitors have an equal capacitance, and the ratio of the resistance value of the first resistor to the resistance value of the second resistor is equal to a ratio of an impedance of the first capacitor to an impedance of the second capacitor.

6. A fully balanced analog circuit comprising:

a first operational amplifier;

first and second resistors connected in series between an inverting input terminal of the first operational amplifier and a first signal input terminal;

third and fourth resistors connected in series between a non-inverting input terminal of the first operational amplifier and the first signal input terminal;

a first capacitor connected between a reference potential supply source and a connecting point between the first and second resistors;

a second capacitor connected between the reference potential supply source and a connecting point between the third and fourth resistors;

a fifth resistor connected between an output terminal of the first operational amplifier and the connecting point between the first and second resistors;

a third capacitor connected between the inverting input terminal and the output terminal of the first operational amplifier;

a sixth resistor connected between the reference potential supply source and the connecting point between the third and fourth resistors;

a fourth capacitor connected between the non-inverting input terminal of the first operational amplifier and the reference potential supply source;

a second operational amplifier having a non-inverting input terminal commonly connected with the non-inverting input terminal of the first operational amplifier;

seventh and eighth resistors connected in series between an inverting input terminal of the second operational amplifier and a second signal input terminal;

ninth and tenth resistors connected in series between the non-inverting input terminal of the second operational amplifier and the second signal input terminal;

a fifth capacitor connected between the reference potential supply source and a connecting point between the seventh and eighth resistors;

a sixth capacitor connected between the reference potential supply source and a connecting point between the ninth and tenth resistors;

an eleventh resistor connected between an output terminal of the second operational amplifier and the connecting point between the seventh and eighth resistors;

a seventh capacitor connected between the inverting input terminal and the output terminal of the second operational amplifier;

a twelfth resistor connected between the reference potential supply source and the connecting point between the ninth and tenth resistors;

an eighth capacitor connected between the non-inverting input terminal of the second operational amplifier and the reference potential supply source; and first and second signal output terminals respectively connected to the output terminals of the first and second operational amplifiers, wherein the first and second operational amplifiers have same characteristics, the first and seventh resistors have same resistance values, the between a non-inverting input terminal of the first operational amplifier and the first signal input terminal;

a first resistor connected between a reference potential supply source and a connecting point between the first and second capacitors;

a second resistor connected between the reference potential supply source and a connecting point between the third and fourth capacitors;

a fifth capacitor connected between an output terminal of the first operational amplifier and the connecting point between the first and second capacitors;

a third resistor connected between the inverting input terminal and the output terminal of the first operational amplifier;

a sixth capacitor connected between the reference potential supply source and the connecting point between the third and fourth capacitors;

a fourth resistor connected between the non-inverting input terminal of the first operational amplifier and the reference potential supply source;

a second operational amplifier having a non-inverting input terminal commonly connected with the non-inverting input terminal of the first operational amplifier;

seventh and eighth capacitors connected in series between an inverting input terminal of the second operational amplifier and a second signal input terminal;

ninth and tenth capacitors connected in series between the non-inverting input terminal of the second operational amplifier and the second signal input terminal;

a fifth resistor connected between the reference potential supply source and a connecting point between the seventh and eighth capacitors;

a sixth resistor connected between the reference potential supply source and a connecting point between the ninth and tenth capacitors;

an eleventh capacitor connected between an output terminal of the second operational amplifier and the connecting point between the seventh and eighth capacitors;

a seventh resistor connected between the inverting input terminal and the output terminal of the second operational amplifier;

a twelfth capacitor connected between the reference potential supply source and the connecting point between the ninth and tenth capacitors;

an eighth resistor connected between the non-inverting input terminal of the second operational amplifier and the reference potential supply source; and first and second signal output terminals respectively connected to the output terminals of the first and second operational amplifiers, wherein the first and second operational amplifiers have same characteristics, the first and fifth resistors have same resistance values, the second and sixth resistors have same resistance values, the third and seventh resistors have same resistance values, the fourth and eighth resistors have same resistance values, the first and seventh capacitors have same capacitances, the second and eighth capacitors have same capacitances, the third and ninth capacitors have same capacitances, the fourth and tenth capacitors have same capacitances, the fifth and eleventh capacitors have same capacitances, the sixth and twelfth capacitors have same capacitances, and a ratio of an impedance of the first capacitor to an impedance of the third capacitor, a ratio of an impedance of the second capacitor to an impedance of the fourth capacitor, a ratio of an impedance of the fifth capacitor to an impedance of the sixth capacitor, a ratio of the resistance value of the first resistor to the resistance value of the second resistor, and a ratio of the resistance value of the third resistor to the resistance value of the fourth-resistor are equal to each other.

7. A fully balanced analog circuit comprising:

a first operational amplifier;

first and second capacitors connected in series between an inverting input terminal of the first operational amplifier and a first signal input terminal;

third and fourth capacitors connected in series between a non-inverting input terminal of the first operational amplifier and the first signal input terminal;

a first resistor connected between a reference potential supply source and a connecting point between the first and second capacitors;

a second resistor conected between the reference potential supply source and a connecting point betwee the third and fourth capacitors;

a fifth capacitor connected between an output terminal of the first operational amplifier and the connecting point between the first and second capacitors;

a third resistor conected between the inverting input terminal and the output terminal of the first operational amplifier;

a sixth capacitor connected between the reference potential supply source and the connecting point between the third and fourth capacitors;

a fourth resistor connected between the non-inverting input terminal of the first operational amplifier and the reference potential supply source;

a second operational amplifier having a non-inverting input terminal commonly connected with the non-inverting input terminal of the first operational amplifier;

seventh and eigth capacitors connected in series between an inverting input terminal of the second operational amplifier and a second signal input terminal;

ninth and tenth capacitors connected in series between the non-inverting input terminal of the second operational amplifier and the second signal input terminal;

a fifth resistor connected between the reference potential supply source and a connecting point between the seventh and eigth capacitors;

a sixth resistor connected between the reference potential supply source and a connecting point between the ninth and tenth capacitors;

an eleventh capacitor connected between an output terminal of the second operational amplifier and the connecting point between the seventh and eight capacitors;

a seventh resistor connected between the inverting input terminal and the output terminal of the second operational amplifier;

a twelfth capacitor connected between the reference potential supply source and the connecting point between the ninth and tenth capacitors;

an eigth resistor connected between the non-inverting input terminal of the second operational amplifier and the reference potential supply source; and first and second signal output terminals respectively connected to the output terminal of the first and second operational amplifiers, wherein the first and second operational amplifiers have same characteristics, the first and fifth resistors have same resistance values, the second and sixth resistors have same resistance values, the third and seventh resistors have same resistance values, the fourth and eigth resistors have same resistance values, the second and eigth capacitors have same capacitances, the third and ninth capacitors have same capacitances, the fifth and eleventh capacitors have same capacitances, the sixth and twelfth capacitors have same capacitances, and a ratio of an impedance of the first capacitor to an impedance of the third capacitor, a ratio of an impedance of the second capacitor to an impedance of the fourth capacitor, a ratio of an impedance of the fifth capacitor to an impedance of the sixth capacitor, a ratio of the resistance value of the second resistor, and a ratio of the resistance value of the third resistor to the resistance value of the fourth resistor are equal to each other.

8. A fully balanced analog circuit comprising:

a first operational amplifier having a non-inverting input terminal connected to a reference potential supply source;

a first resistor connected between an inverting input terminal of the first operational amplifier and a first signal input terminal;

a second resistor connected between the inverting input terminal and an output terminal of the first operational amplifier;

a first capacitor connected between the inverting input terminal and the output terminal of the first operational amplifier;

a second operational amplifier having a non-inverting input terminal connected to the reference potential supply source;

a third resistor connected between an inverting input terminal of the second operational amplifier and the output terminal of the first operational amplifier;

a second capacitor connected between the inverting input terminal and an output terminal of the second operational amplifier;

a third operational amplifier;

a fourth resistor connected between an inverting input terminal of the third operational amplifier and the output terminal of the second operational amplifier;

a fifth resistor connected between the inverting input terminal and an output terminal of the third operational amplifier;

a sixth resistor connected between a non-inverting input terminal of the third operational amplifier and the output terminal of the second operational amplifier;

a seventh resistor connected between the non-inverting input terminal of the third operational amplifier and the reference potential supply source;

an eighth resistor connected between the inverting input terminal of the first operational amplifier and the output terminal of the third operational amplifier;

a fourth operational amplifier having a non-inverting input terminal connected to the reference potential supply source;

a ninth resistor connected between an inverting input terminal of the fourth operational amplifier and a second signal input terminal;

a tenth resistor connected between the inverting input terminal and an output terminal of the fourth operational amplifier;

a third capacitor connected between the inverting input terminal and the output terminal of the fourth operational amplifier;

a fifth operational amplifier having a non-inverting input terminal connected to the reference potential supply source;

an eleventh resistor connected between an inverting input terminal of the fifth operational amplifier and the output terminal of the fourth operational amplifier;

a fourth capacitor connected between the inverting input terminal and an output terminal of the fifth operational amplifier;

a sixth operational amplifier having a non-inverting input terminal commonly connected to the non-inverting input terminal of the third operational amplifier;

a twelfth resistor connected between an inverting input terminal of the sixth operational amplifier and the output terminal of the fifth operational amplifier;

a thirteenth resistor connected between the inverting input terminal and an output terminal of the sixth operational amplifier;

a fourteenth resistor connected between the non-inverting input terminal of the sixth operational amplifier and the output terminal of the fifth operational amplifier;

a fifteenth resistor connected between the non-inverting input terminal of the sixth operational amplifier and the reference potential supply source;

a sixteenth resistor connected between the inverting input terminal of the fourth operational amplifier and the output terminal of the sixth operational amplifier; and first and second signal output terminals respectively connected to the output terminals of the third and sixth operational amplifiers;

wherein each of pairs of the first and fourth operational amplifiers, the second and fifth operational amplifiers, and the third and sixth operational amplifiers have same characteristics, the first and ninth resistors have same resistance values, the second and tenth resistors have same resistance values, the third and eleventh resistors have same resistance values, the fourth and twelfth resistors have same resistance values, the fifth and thirteenth resistors have same resistance values, the sixth and fourteenth resistors have same resistance values, the seventh and fifteenth resistors have same resistance values, the eighth and sixteenth resistors have same resistance values, the first and third capacitors have same capacitances, the second and fourth capacitors have same capacitances, and a ratio of the resistance value of the fourth resistance is equal to a ratio of the resistance value of the fifth resistor to the resistance value of the seventh resistor.

9. A fully balanced analog circuit according to claim 3, wherein at least one of the first to eighth resistors is a switched capacitor circuit.

10. A fully balanced analog circuit according to claim 4, wherein at least one of the first to eighth resistors is a switched capacitor circuit.

11. A fully balanced analog circuit according to claim 5, wherein at least one of the first to eighth resistors is a switched capacitor circuit.

12. A fully balanced analog circuit according to claim 6, wherein at least one of the first to twelfth resistors is a switched capacitor circuit.

13. A fully balanced analog circuit according to claim 7, wherein at least one of the first to eighth resistors is a switched capacitor circuit.

14. A fully balanced analog circuit according to claim 8, wherein at least one of the first to sixteenth resistors is a switched capacitor circuit.

* * * * *